(12) United States Patent
Sakama et al.

(10) Patent No.: US 7,586,446 B2
(45) Date of Patent: Sep. 8, 2009

(54) IC TAG-BEARING WIRING BOARD AND METHOD OF FABRICATING THE SAME

(75) Inventors: Isao Sakama, Hiratsuka (JP); Minoru Ashizawa, Tokyo (JP)

(73) Assignee: Hitachi, Ltd. (JP)

( * ) Notice: Subject to any disclaimer, the term of this patent is extended or adjusted under 35 U.S.C. 154(b) by 221 days.

(21) Appl. No.: 11/061,149

(22) Filed: Feb. 18, 2005

(65) Prior Publication Data
US 2006/0001138 A1    Jan. 5, 2006

(30) Foreign Application Priority Data
Jun. 30, 2004    (JP) .............................. 2004-193719

(51) Int. Cl.
*H01Q 1/24*    (2006.01)
(52) U.S. Cl. ................................. 343/702; 343/700 MS
(58) Field of Classification Search ................ 343/702, 343/795, 793, 700 MS, 873; 257/678; 438/106
See application file for complete search history.

(56) References Cited

U.S. PATENT DOCUMENTS 5,566,441 A * 10/1996 Marsh et al. .................. 29/600
5,995,006 A   11/1999 Walsh
6,719,206 B1 *  4/2004 Bashan et al. ................ 235/492
6,891,506 B2 *  5/2005 Jarmuszewski et al. ..... 343/702
6,980,173 B2 * 12/2005 Man et al. .................... 343/841
6,985,112 B2 *  1/2006 Sadamori et al. ............ 343/702
2005/0017906 A1 *  1/2005 Man et al. ............. 343/700 MS
2006/0109130 A1 *  5/2006 Hattick et al. ............ 340/572.7

FOREIGN PATENT DOCUMENTS

| JP | 11-317609      | 11/1999 |
|----|----------------|---------|
| JP | 2003-233794 A  | 8/2003  |
| JP | 2003-234673    | 8/2003  |
| WO | WO97/09641 A1  | 3/1997  |

* cited by examiner

*Primary Examiner*—HoangAnh T Le
(74) *Attorney, Agent, or Firm*—Townsend and Townsend and Crew LLP

(57) ABSTRACT

To improve electronic part packaging efficiency without sacrificing the transmission distance of a radio IC tag, a recess is formed in the front side surface of a printed wiring board. An IC chip is placed in the recess so that the IC chip does not protrude from the front side surface, a first major surface 1a and a second major surface of the printed wiring board. Antenna elements of an antenna are formed on the front side surface on the opposite sides, respectively, of the IC chip, and the antenna is connected to the IC chip. The antenna is a dipole antenna of a length equal to half the wavelength of radio waves to be radiated by the antenna.

6 Claims, 11 Drawing Sheets

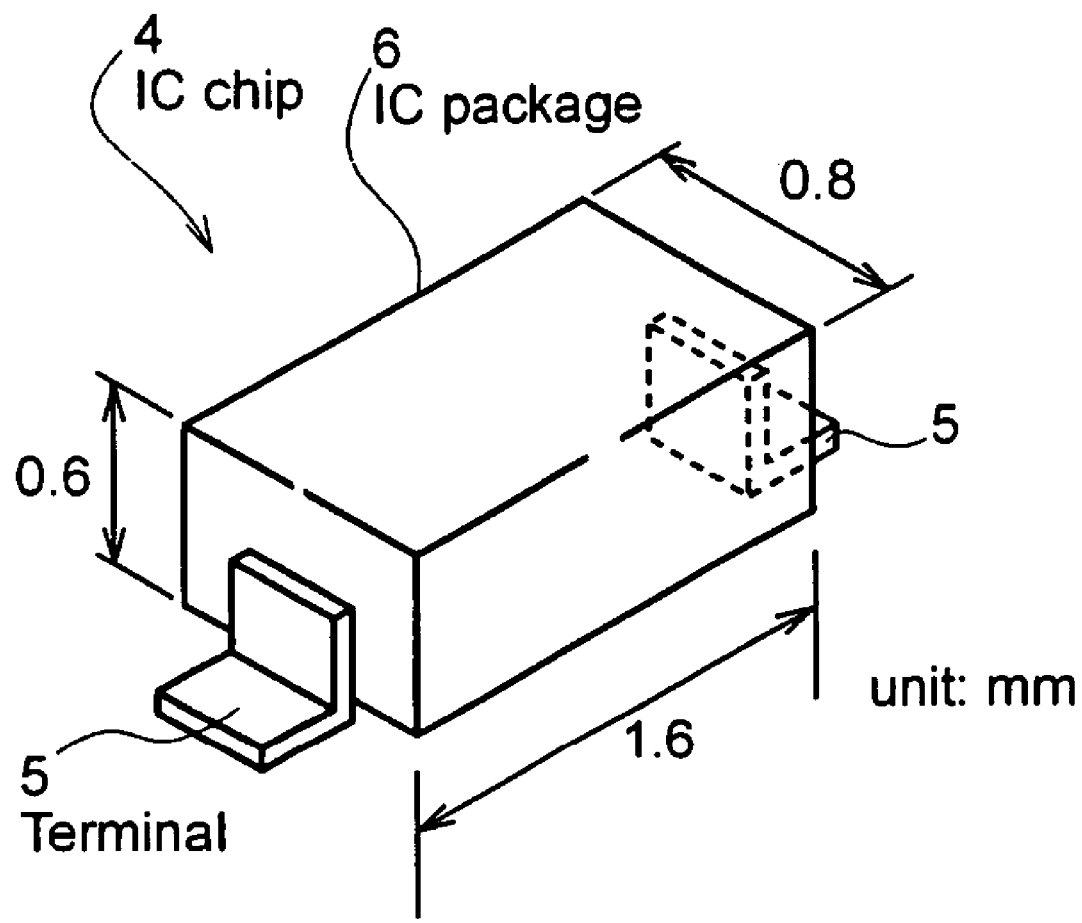

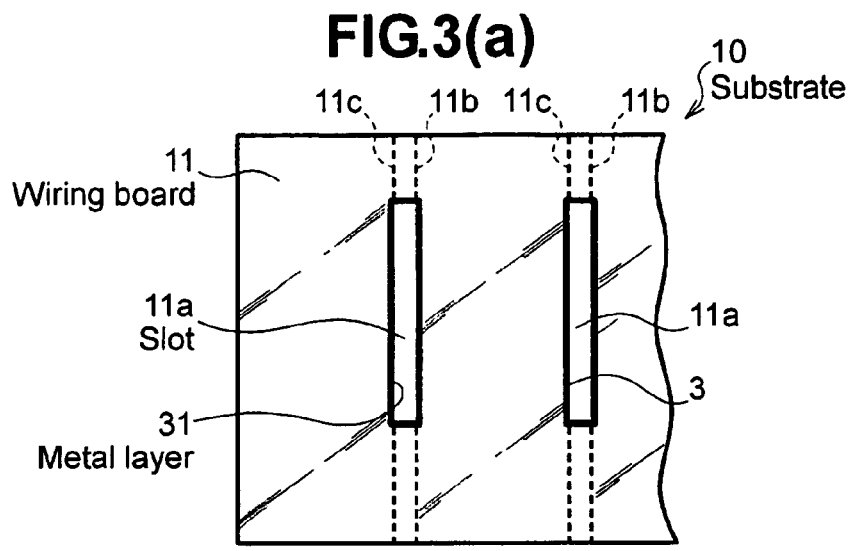
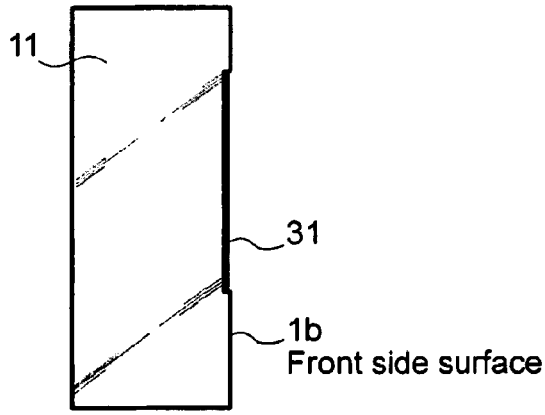
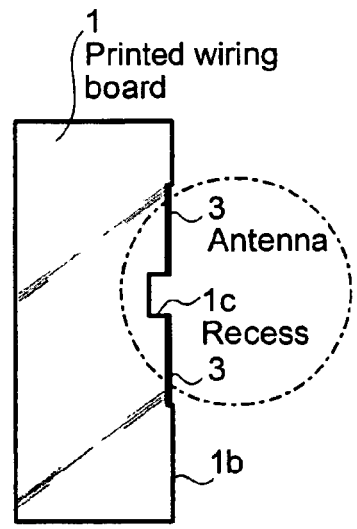
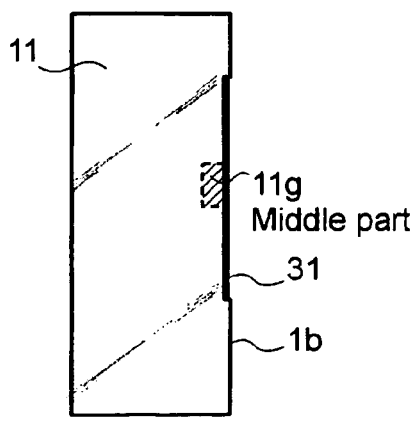
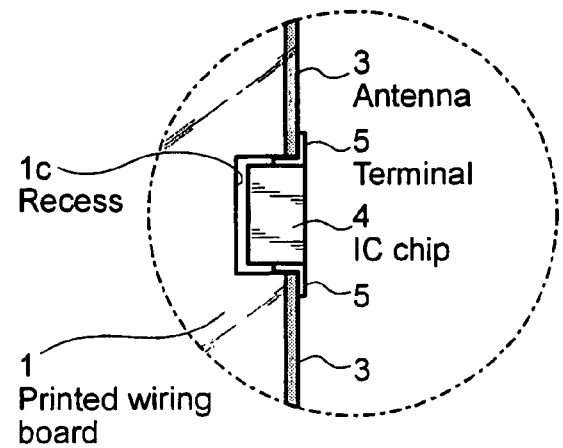

Prior Art

IC TAG-BEARING WIRING BOARD AND METHOD OF FABRICATING THE SAME

CROSS-REFERENCES TO RELATED APPLICATIONS

The present application is related to and claims priority from Japanese Patent Application No. 2004-193719, filed Jun. 30, 2004, and is hereby incorporated by reference for all purposes.

BACKGROUND OF THE INVENTION

The present invention relates to an IC tag-bearing wiring board provided with a radio IC tag capable of transmitting in-formation recorded in an IC chip by radio and a method of fabricating the IC tag-bearing wiring board.

Radio IC tags are used widely for the identification of articles. A plurality of printed wiring boards included in an electronic apparatus are provided with radio IC tags, respectively, to recognize information about the printed wiring boards. When the electronic apparatus malfunctions and the printed wiring board of the electronic apparatus needs to be changed, pieces of information about the manufacture of the printed wiring board and pieces of technical information about the printed wiring board are read in a noncontact read mode (by radio) from the radio IC tag incorporated into the printed wiring board to collect information characteristic of the printed wiring board to be changed for the support of changing work. Such a radio IC tag has a small IC chip recording information and an antenna for transmitting radio waves representing the information recorded in the IC chip. The IC chip and the antenna are mounted on a first or a second major surface of a printed wiring board to form an IC tag-bearing wiring board.

FIGS. 10(a) and 10(b) are a front perspective view and a top view, respectively, of a conventional IC tag-bearing wiring board. As shown in FIGS. 10(a) and 10(b), an antenna 23 is formed on a part, near the front side surface, of a first major surface (mounting surface) 1a of a printed wiring board 21 and is connected electrically to an IC chip 24 placed on the first major surface 1a of the printed wiring board 21 to form a radio IC tag 22. The radio IC tag 22, similarly to other electronic parts, can be formed by connecting the antenna 23 formed on a second major surface (pattern forming surface) of the printed wiring board 21 to the IC chip 24 placed on the first major surface 1a by through holes. When the IC tag-bearing wiring board thus formed is incorporated into an electronic apparatus, information recorded in the IC chip 24 can be read in a non-contacting read mode by placing a reader, not shown, near the radio IC tag 22 placed near the front side surface of the printed wiring board 21.

A technique is disclosed in, for example, JP Heisei 11-515094 (U.S. Pat. No. 5,995,006, incorporated herein by reference for all purposes) for forming a radio IC tag. The reference describes forming antenna patterns on layers of a multilayer printed wiring board excluding a top layer, mounting an IC chip on a first major surface of the multilayer printed wiring board, and connecting the IC chip to the antenna patterns by, for example, through holes. This technique that forms the antenna patterns in the inner layers is able to use a part mounting space on the first major surface effectively, and the antenna patterns having a short length and formed on the layers are able to form an antenna of a desired length. Thus, the radio IC tag including the antenna can be formed in a small size.

The antenna 23 of the radio IC tag 22 of the conventional IC tag-bearing wiring board shown in FIGS. 10(a) and 10(b) is formed on a part of a first or a second major surface of the printed wiring board 21. The part in which the antenna 13 is formed cannot be used for mounting electronic parts. Although the technique previously disclosed in JP Heisei 11-515094 forms antenna patterns in parts of the inner layers of the multilayer printed wiring board, electronic parts cannot be mounted in a part of the top layer corresponding to the parts of the inner layers in which the antenna patterns are formed. Thus the antenna of the radio IC tag formed on the first or the second major surface of the printed wiring board reduces electronic part packaging efficiency. If the antenna is a dipole antenna, the antenna functions at the highest radiation efficiency when the length of the antenna is equal to $\lambda/2$, where $\lambda$ is the wavelength of radio waves to be transmitted. A printed wiring board having a large surface area must be used to maintain desired communication ability by forming the antenna in a necessary length. The conventional IC tag-bearing wiring board is unable to meet contradictory conditions respectively requiring maintaining a desired communication ability and improving electronic part packaging efficiency.

The conventional IC tag-bearing wiring board is provided with the antenna on the first or the second major surface of the printed wiring board. When the printed wiring board is a multilayer printed wiring board, the antenna is formed on the inner layers of the printed wiring board. Therefore, the antenna of the radio IC tag cannot be formed such that the antenna has a directivity in a desired specific direction. Consequently, radio waves radiated by the antenna of one IC tag-bearing wiring board propagate in a comparatively wide area at a short range. In an electronic apparatus provided with a plurality of stacked IC tag-bearing wiring boards, radio waves radiated by the antennas of the stacked IC tag-bearing wiring boards interfere with each other, and, in some cases, information provided by a desired one of those IC tag-bearing wiring boards cannot be identified.

BRIEF SUMMARY OF THE INVENTION

The present invention provides an IC tag-bearing wiring board capable of supporting electronic parts in a high packaging efficiency without shortening transmission distance and having an antenna directivity in a desired direction, and a method of fabricating such an IC tag-bearing wiring board.

More specifically, the present invention provides an IC tag-bearing wiring board formed by mounting an IC tag including an IC chip for recording information and an antenna for radiating radio signals representing information recorded in the IC chip on a wiring board, in which the antenna is formed on a side surface of the wiring board. For example, the IC tip is held in a recess formed in the side surface of the wiring board such that the outer surface of the IC chip sinks beneath a plane including the side surface. The IC tag-bearing wiring board may be provided on the front or the back surface of the wiring board with an auxiliary antenna capable of making the antenna radiate radio waves in a desired direction.

According to the present invention, the antenna of the radio IC tag is formed in the side surface of the wiring board. Therefore, the first and the second major surface of the wiring board can be effectively used for mounting electronic parts on the wiring board, and electronic parts can be mounted on the first major surface of the wiring board in a high packaging efficiency.

Since the directivity of the antenna in a desired direction can be controlled by the auxiliary antenna formed on the first or the second major surface of the wiring board, signals provided by the IC chips of the radio IC tags of a plurality of stacked IC tag-bearing wiring boards can be accurately received and information about the wiring boards can be read.

BRIEF DESCRIPTION OF THE DRAWINGS

These and other features, objects and advantages of the present invention will become more apparent from the following description when taken in conjunction with the accompanying drawings.

FIG. 2 is a perspective view of an IC chip included in the IC tag-bearing wiring board shown in FIGS. 1(a) and 1(b).

FIGS. 3(a) to 3(e) show views in explaining steps of an IC tag-bearing wiring board manufacturing method according to the present invention.

DETAILED DESCRIPTION OF THE INVENTION

Figure 1A:
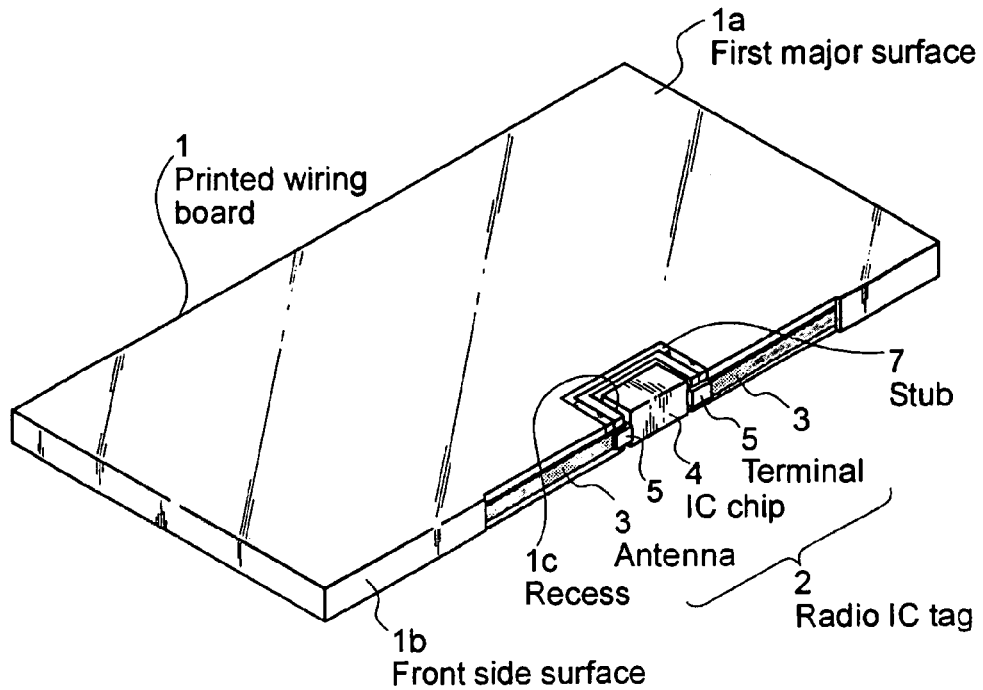
FIGS. 1(a) and 1(b) are a front perspective view and a top view, respectively, of an IC tag-bearing wiring board in a first embodiment according to the present invention.

An IC tag-bearing wiring board in a preferred embodiment according to the present invention and a method of fabricating the same will be described with reference to the accompanying drawings, in which the same components are denoted by the same reference characters, respectively.

An IC tag-bearing wiring board according to the present invention is characterized by a high packaging efficiency in which electronic parts are mounted on a mounting surface of a printed wiring board included in the IC tag-bearing wiring board achieved by forming an antenna included in the IC tag-bearing wiring board on a side surface of the printed wiring board. The antenna can be formed on the side surface of the printed wiring board by a through hole forming process and a wiring board dividing process included in a printed wiring board manufacturing process without adding any special process to the conventional printed wiring board manufacturing process. Thus the electronic part packaging efficiency can be improved without increasing manufacturing cost. When an auxiliary antenna capable of forming a desired radiation angle with the antenna formed on the side surface of the printed wiring board is formed on the first or the second major surface of the printed wiring board, it is possible to make the antenna radiate radio waves at a high directivity in a desired direction.

First Embodiment

Figure 1B:
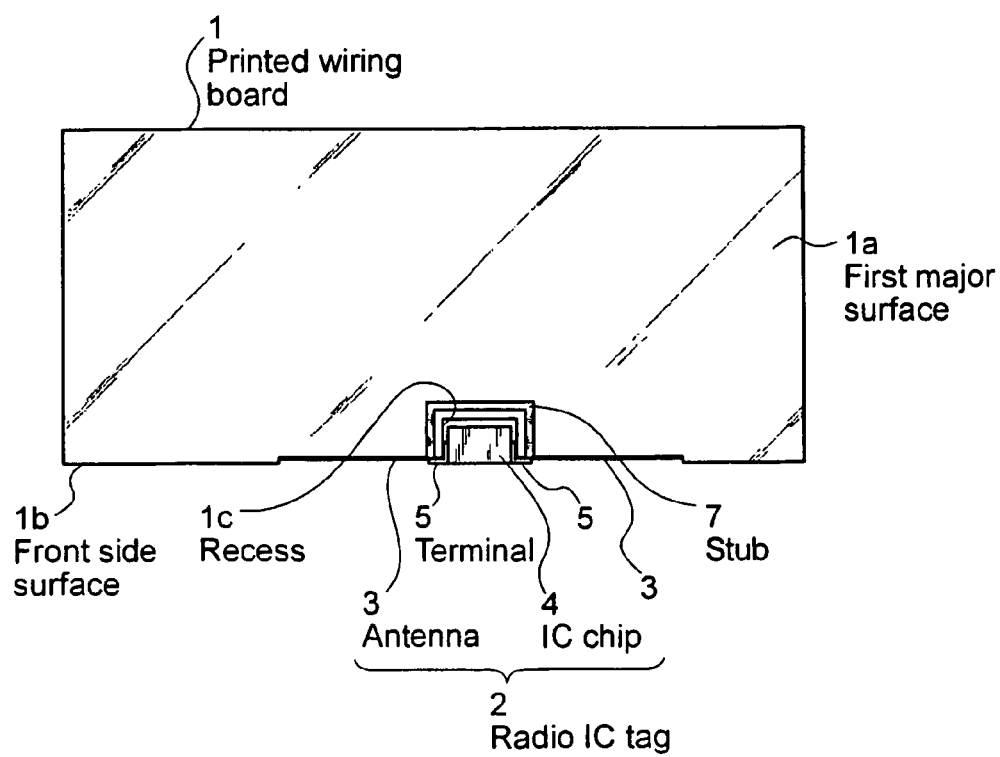

FIGS. 1(a) and 1(b) are a front perspective view and a top view, respectively, of an IC tag-bearing wiring board in a first embodiment according to the present invention. Referring to FIGS. 1(a) and 1(b), a recess 1c is formed in a middle part of the front side surface 1b of a printed wiring board 1, and an antenna 3 consisting of two antenna elements formed on the front side surface 1b so as to extend on the opposite sides of the recess 1c, respectively. The antenna 3 is a dipole antenna of a length equal to $\lambda/2$, where $\lambda$ is the wavelength of radio waves to be radiated by the antenna. The antenna 3 of $\lambda/2$ in length radiates radio waves having a wavelength of $\lambda$ at a maximum radiation efficiency. An IC chip 4 is placed in the recess 1c formed between the two antenna elements of the antenna 3. The antenna elements of the antenna 3 are connected electrically to terminals 5 of the IC chip 4. Many electronic parts, not shown, are mounted on a first major surface 1a of the printed wiring board 1 and are connected electrically to a circuit pattern formed on a second major surface of the printed wiring board 1 by through holes. A stub 7 matches the impedance of the antenna 3 to that of the IC chip 4 and prevents the electrostatic breakdown of the IC chip 4 by the dc short-circuiting of the IC chip 4.

The stub 7 may be omitted if any space for the stub 7 is available on the printed wiring board 1. Although the omission of the stub 7 shortens communication distance, the omission of the stub 7 has no influence on the operation of the IC chip 4.

Referring to FIG. 2 showing the IC chip 4 included in the IC tag-bearing wiring board in a perspective view, the IC chip 4 is formed by attaching terminals 5 to opposite end surfaces of an IC package 6 of 1.6 mm×0.8 mm×0.6 mm. In the printed wiring board 1 shown in FIGS. 1(a) and 1(b), the recess 1c is formed to a depth slightly greater than 0.6 mm and with a width slightly greater than 1.6 mm. The thickness of the printed wiring board 1 is about 0.8 mm. Thus the IC chip 4 placed in the recess 1c does not protrude from the front side surface 1b, the first major surface 1a and the second major surface of the printed wiring board 1 as shown in FIGS. 1(a) and 1(b).

An IC tag-bearing wiring board manufacturing method of fabricating the IC tag-bearing wiring board will be described. FIGS. 3(a) and 3(b) illustrate steps of the IC tag-bearing wiring board manufacturing method. Referring to FIG. 3(a), a plurality of wiring boards 11 are formed in a substrate 10, and slots 11a are formed in the substrate 10 between the adjacent wiring boards 11. The slots 11a are formed simultaneously with the through holes by a through hole forming process. The length of the slots 11a is equal to half the wavelength of radio waves to be sent out.

A first step plates the side walls of the through holes formed in the wiring boards 11 of the substrate 10 and the side surfaces of the slots 11a. Metal layers 31 are formed on the side surfaces of the slots 11a, respectively. Gold plating can be used for improved oxidation properties, though additional processing steps may be required. Alternatively, a layer of insulation can be provided over the metal layer 31.

A second step cuts the substrate 10 along cutting lines 11c and 11b such that metal layers 31 formed on the left side surfaces, as viewed in FIG. 3(a), of the slots 11a remain unremoved to divide the substrate 10 into the wiring boards 11 each having the metal layer 31 of a predetermined length on its front side surface 1b as shown in FIG. 3(b). A third step cuts off a middle part 11g of the metal layer 31 corresponding to the IC chip 4 as shown in FIG. 3(c) to obtain the printed wiring board 1 provided with the recess 1c and the antenna 3 of the metal layer 31 as shown in FIG. 3(d).

Then, many electronic parts are mounted on the front surface of the printed wiring board 1 shown in FIG. 3(d) by an insert machine or the like. A fourth step disposes the IC chip 4 shown in FIG. 2 in the recess 1c as shown in FIG. 3(e), and the terminals 5 of the IC chip 4 are connected to the antenna 3 by soldering. Since the IC chip 4 is placed in the recess 1c formed in the front side surface 1b of the printed wiring board 1, the front side surface 1b is flat. Thus IC chip 4 is prevented from falling off the printed wiring board 1 due to accidental colliding against the casing of an apparatus or a tool during the handling of the printed wiring board 1.

Since the antenna 3 of the radio IC tag 2 is not formed on the first major surface 1a or the second major surface of the printed wiring board 1 and is formed in the front side surface 1b of the printed wiring board 1 as shown in FIGS. 1(a) and 1(b), electronic parts can be mounted on the printed wiring board 1 at a high electronic part packaging efficiency.

When the antenna 3 is formed on the front side surface 1b of the printed wiring board 1, it is desirable to form the stub 7 so as to connect the antenna elements of the antenna 3 as indicated by dotted lines in FIGS. 1(a) and 1(b) to match the impedance of the antenna 3 to that of the IC chip 4 and to prevent electrostatic breakdown. For example, the stub 7 may be formed by plating on the side surface of recess 1c. When the radio IC tag 2 is provided with the stub 7, a high-frequency antenna current flows through the IC chip 4 and the IC chip 4 functions effectively, and static electricity flows in a dc current through the stub 7. Thus the IC chip 4 from breakage will not be damaged by static electricity.

Second Embodiment

Figure 4A:
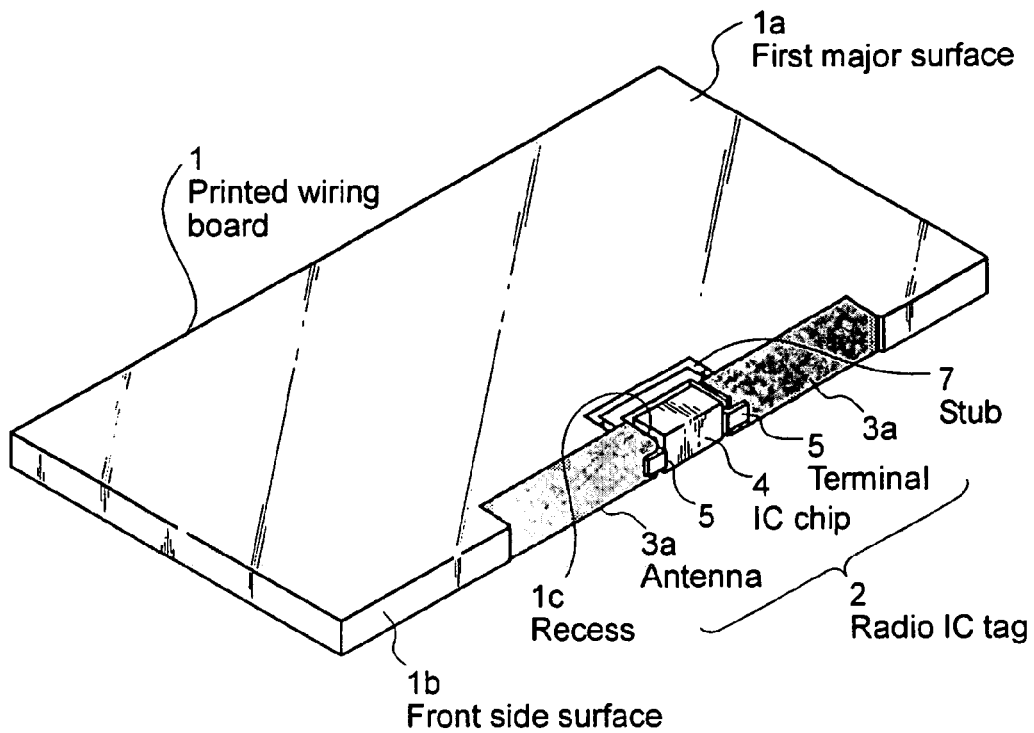
FIGS. 4(a) and 4(b) are a front perspective view and a top view, respectively, of an IC tag-bearing wiring board in a second embodiment according to the present invention.
Figure 4B:
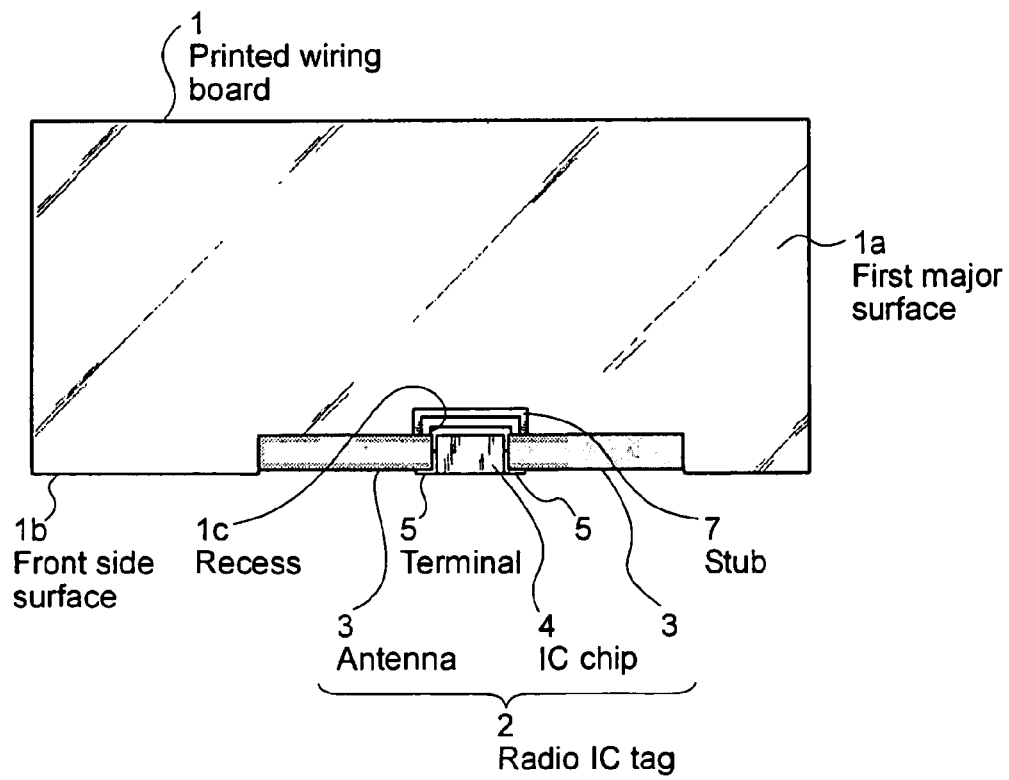

FIGS. 4(a) and 4(b) are a front perspective view and a top view, respectively, of an IC tag-bearing wiring board in a second embodiment according to the present invention. As shown in FIG. 4(a), an antenna 3a may be formed so as to extend from the front side surface 1b and a first major surface 1a (or a second major surface, not shown) of a printed wiring board 1. The antenna 3a may be extended from the front side surface 1b of the printed wiring board 1 on both the first major surface 1a and the second major surface. The antenna 3a thus formed in a wide area is capable of radiating radio waves in a wide radiation area and, consequently, the range of directivity of an radio IC tag 2 including the antenna 3a can be expanded. It is desirable also to connect the antenna elements of the antenna 3a shown in FIGS. 4(a) and 4(b) by a stub 7 extended across an IC chip 4 for electrostatic breakdown prevention and impedance matching. The antenna 3a can be formed by the aforesaid process.

Third Embodiment

Figure 5A:
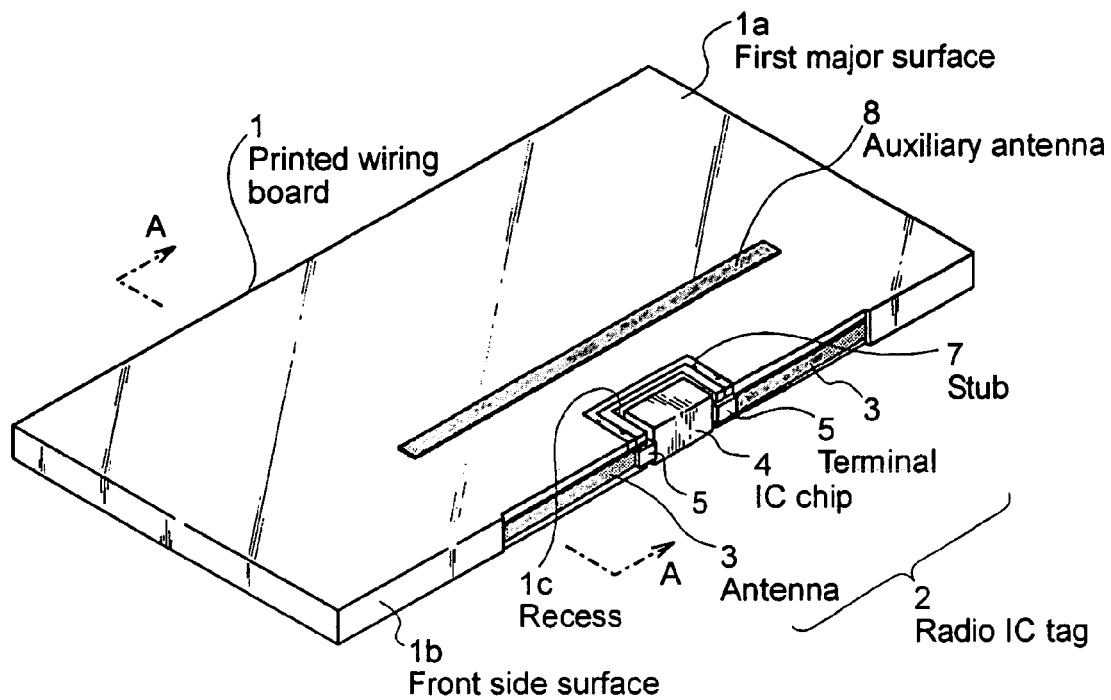
FIG. 5(a) is a front perspective view of an IC tag-bearing wiring board in a third embodiment according to the present invention and FIG. 5(b) is a sectional view taken on the line A-A in FIG. 5(a).
Figure 5B:
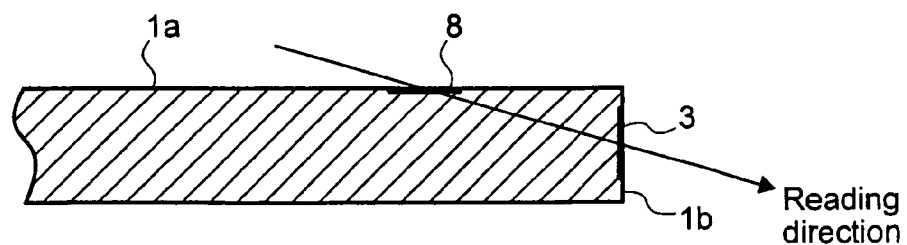

FIG. 5(a) is a front perspective view of an IC tag-bearing wiring board in a third embodiment according to the present invention and FIG. 5(b) is a sectional view taken on the line A-A in FIG. 5(a). As sown in FIG. 5(a), the IC tag-bearing wiring board in the third embodiment is provided with, in addition to an antenna 3 similar to that of the first embodiment, an auxiliary antenna 8. The auxiliary antenna 8 is formed parallel to the antenna 3 at a predetermined position on a first major surface 1a of a printed wiring board 1. Then, as shown in FIG. 5(b), the antenna 3 has a very high directivity in the direction of the arrow parallel to a line connecting the auxiliary antenna 8 and the antenna 3. The auxiliary antenna 8 formed in a length longer than that of the antenna 3 serves as a reflector that increases the directivity of the antenna 3 in the direction of the arrow. Pieces of information can be read from the radio IC tag of a desired one of a plurality of printed wiring boards 1 stacked to form an electronic apparatus because the antenna 3 has a high directivity.

Figure 6A:
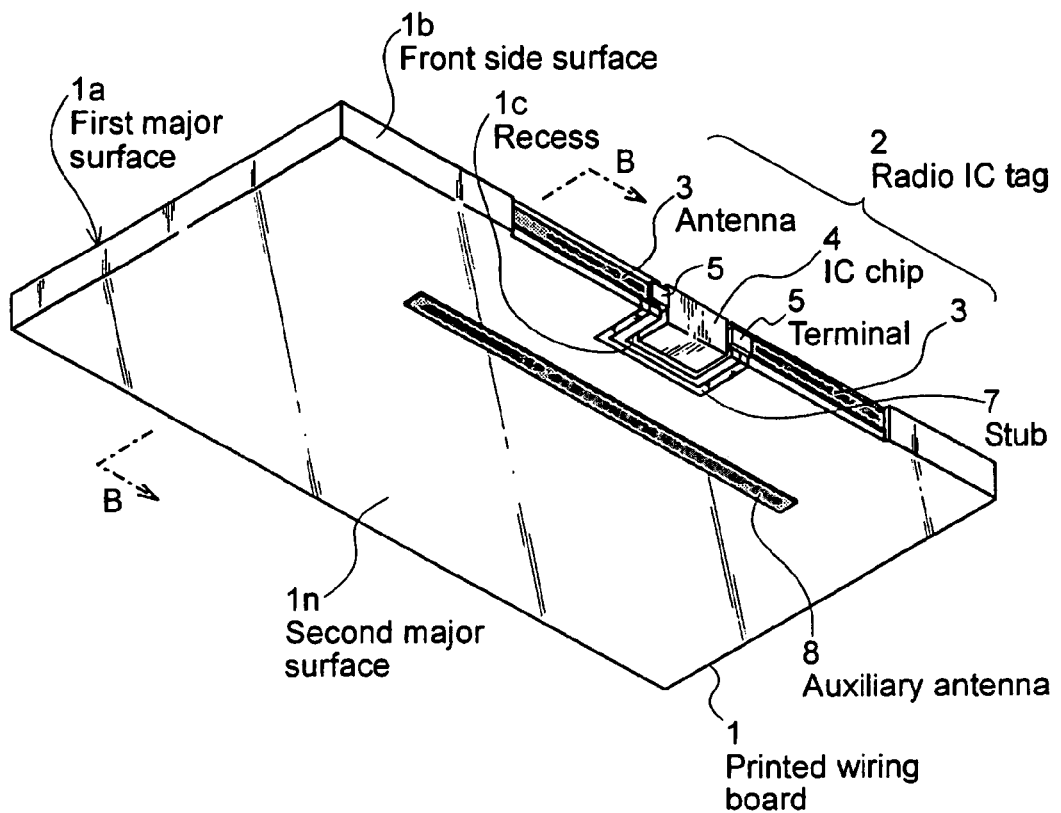
FIG. 6(a) is a back perspective view of an IC tag-bearing wiring board in a modification of the IC tag-bearing wiring board in the third embodiment and FIG. 6(b) is a sectional view taken on the line B-B in FIG. 6(a).
Figure 6B:
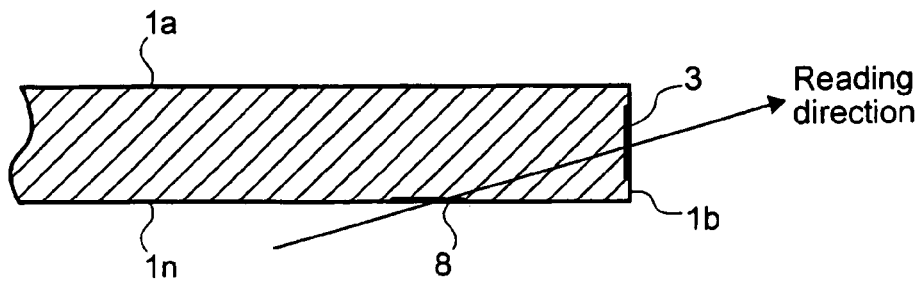

FIG. 6(a) is a back perspective view of an IC tag-bearing wiring board in a modification of the IC tag-bearing wiring board in the third embodiment and FIG. 6(b) is a sectional view taken on the line B-B in FIG. 6(a). As shown in FIG. 6(a), an auxiliary antenna 8 is formed on a second major surface 1n of a printed wiring board 1 and an antenna 3 is formed in the front side surface of the printed wiring board 1. Thus, as shown in FIG. 6(b), the antenna 3 has a very high directivity in the direction of the arrow parallel to a line connecting the auxiliary antenna 8 and the antenna 3. The directivity of the antenna 3 can be adjusted in a direction perpendicular to the front side surface 1b of the printed wiring board 1 by forming auxiliary antennas 8 on both a first major surface 1a and the second major surface 1n, respectively.

The length of the auxiliary antenna 8 may be optionally determined. The directivity of the antenna for radio waves of a desired wavelength can be increased by determining the length of the auxiliary antenna 8 according to the wavelength $\lambda$ of radio waves to be sent out. When different working frequencies are assigned to different radio IC tags 2, respectively, and the radio IC tags 2 are provided with auxiliary antennas 8 of different lengths conforming respectively to the different wavelengths, respectively, information can be read from the radio IC tags 2 from specific directions corresponding to the directivities of the antennas of the radio IC tags 2, respectively. Thus, failure in reading information about the printed wiring board can be prevented and incorrect information reading can be prevented.

Another IC tag-bearing wiring board in another modification of the third embodiment will be described with reference to FIGS. 7(a) and 7(b).

An auxiliary antenna 8' is not formed on a printed wiring board 1 and is formed on a case 20 holding the printed wiring board 1. The auxiliary antenna 8' is able to function as a waveguide when the same is formed in a length shorter than that of an antenna 3 formed on the printed wiring board 1. In this IC tag-bearing wiring board, the antenna 3 has a directivity in a direction from the antenna 3 toward the auxiliary antenna 8' (reading direction), which is reverse to the directivity of the antenna 3 of the third embodiment in a direction from the auxiliary antenna 8 toward the antenna 3.

Figure 7A:
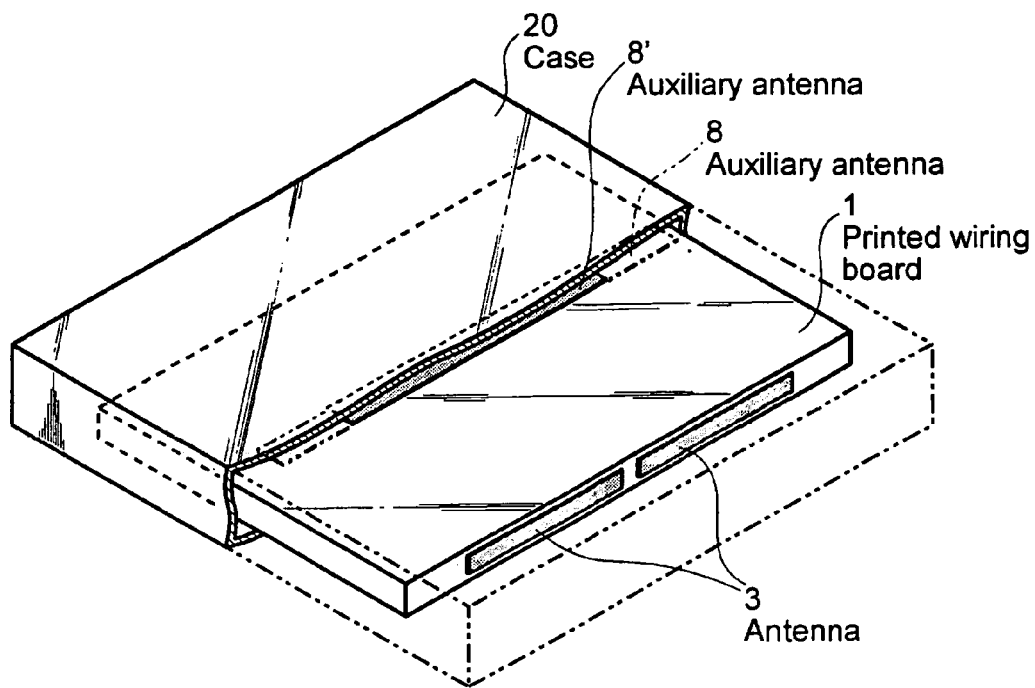
FIGS. 7(a) and 7(b) show views of an IC tag-bearing wiring board in another modification of the IC tag-bearing wiring board in the third embodiment.
Figure 7B:
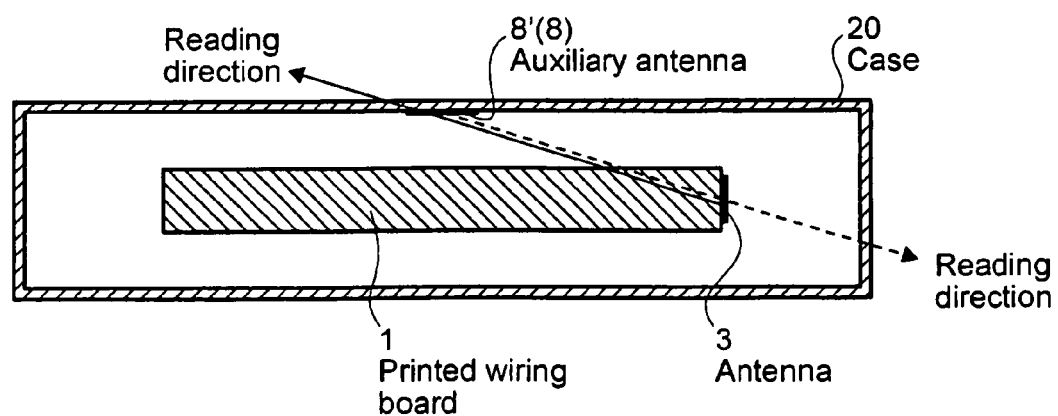

Naturally, an antenna 8 of a length longer than that of the antenna 3 may be formed on the case 20 as shown in FIG. 7(a) to adjust the directivity of the antenna 3 in a direction from the auxiliary antenna 8 toward the antenna 3 (reading direction) as shown in FIG. 7(b). The position of the auxiliary antenna 8 is not subject to the disposition of electronic parts on the printed wiring board 1 and hence the position of the auxiliary antenna 8 can be optionally determined to change the directivity when the auxiliary antenna 8 is formed on the case 20.

Fourth Embodiment

Figure 8A:
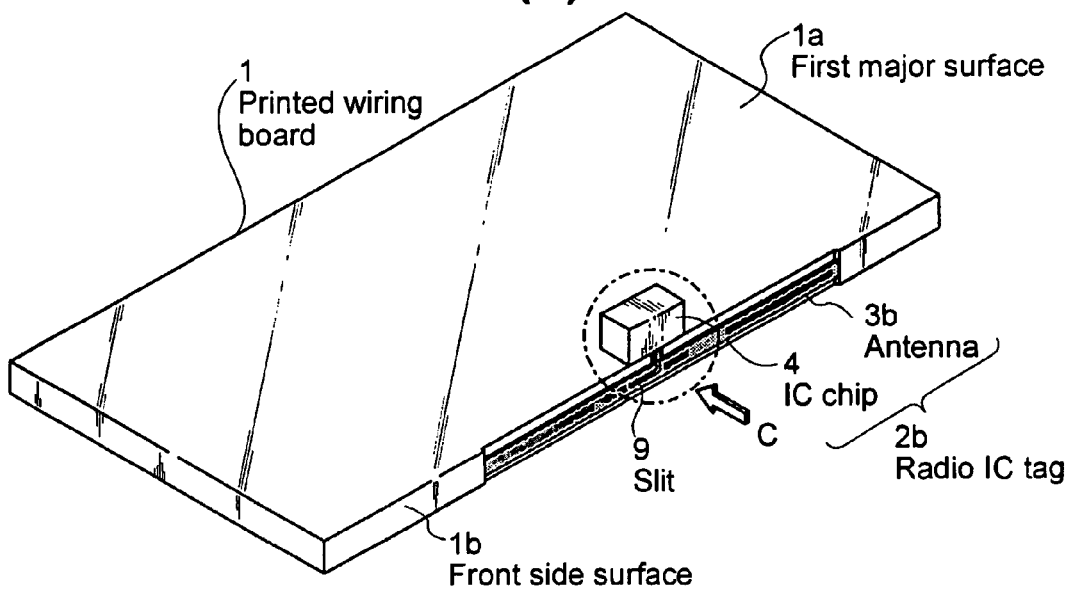
FIGS. 8(a) and 8(b) are a front perspective view and a top view, respectively, of an IC tag-bearing wiring board in a fourth embodiment according to the present invention.
Figure 8B:
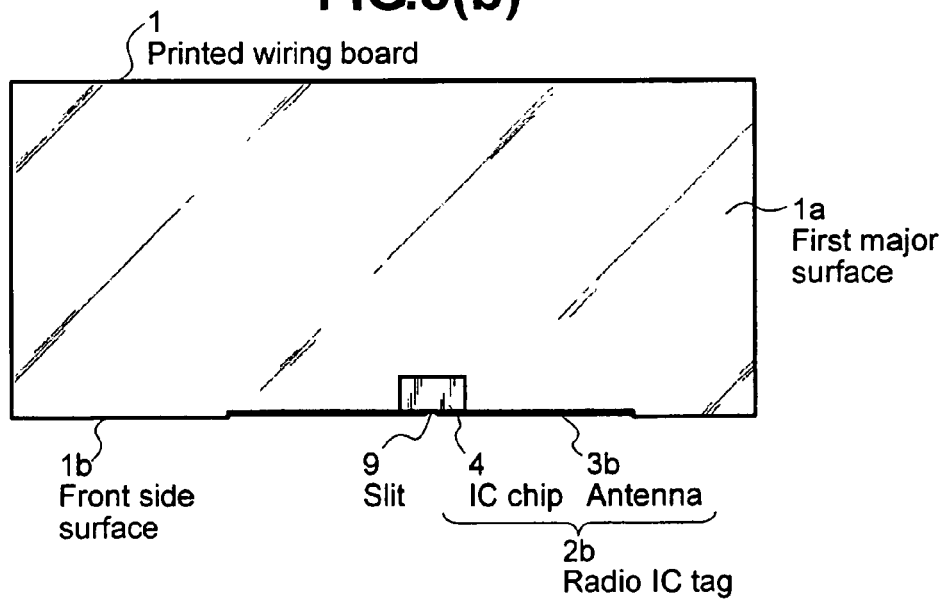
Figure 8C:
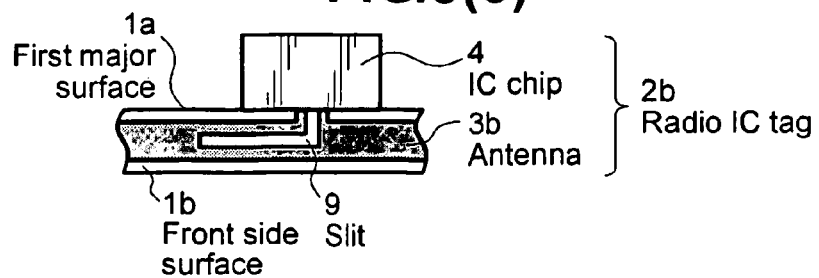
FIG. 8(c) is a close-up front view of the circled area C shown in FIG. 8(a).

FIGS. 8(a) and 8(b) are a front perspective view and a top view, respectively, of an IC tag-bearing wiring board in a fourth embodiment according to the present invention and FIG. 8(c) is an enlarged, fragmentary side elevation taken along the direction of the arrow c in FIG. 8(a). The IC tag-bearing wiring board shown in these figures differs from the IC tag-bearing wiring board shown in FIGS. 1(a) and 1(b) in that an IC chip 4 is placed on a first major surface 1a of a printed wiring board 1, and an antenna 3b is an undivided antenna of a length equal to λ/2, where λ is the wavelength of radio waves to be radiated by the antenna 3b, formed on the front side surface 1b. As shown in FIG. 8(a), an L-shaped slit 9 is formed in a central part of the antenna 3b to prevent electrostatic breakdown and to provide impedance matching.

Figure 8D:
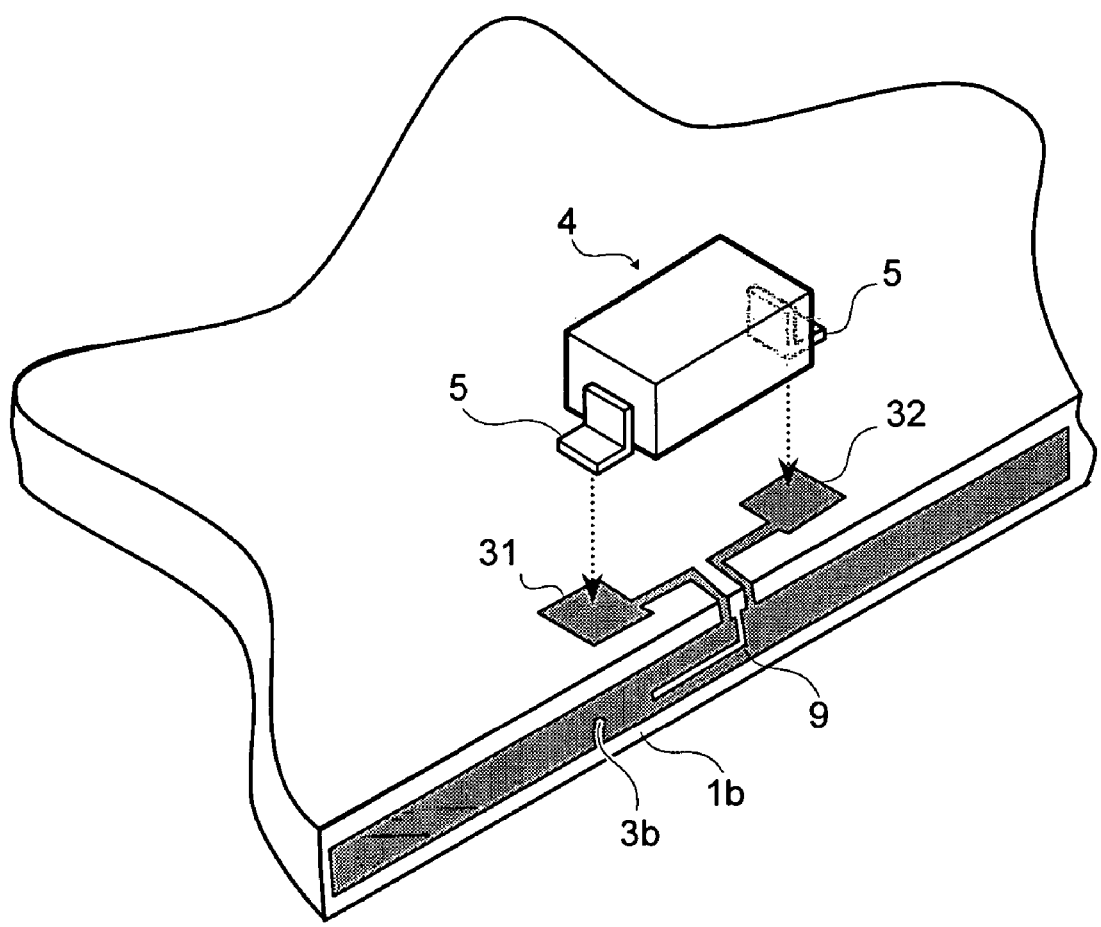
FIG. 8(d) is a perspective top view of the circled area C shown in FIG. 8(a).

Whereas the antenna 3 of the first embodiment is divided into the two antenna elements and a recess for receiving the IC chip 4 is formed between the two antenna elements, the antenna 3b of the fourth embodiment does not need to be divided into two parts. The L-shaped slit 9 can be formed in the central part of the antenna 3b as shown in FIG. 8(c). The perspective view shown in FIG. 8(d) shows more clearly the formation of the antenna 3b and the L-shaped slit 9, including mounting pads 31 for mounting by the IC chip 4. Thus electrostatic breakdown prevention and impedance matching can be achieved without forming any external stub, such as the stub 7 of the first embodiment. Although the IC chip 4 is disposed on the first major surface 1a of the printed wiring board 1 in the fourth embodiment, the IC chip 4 reduces electronic part packaging efficiency scarcely because the IC chip 4 is small and is disposed contiguously with an edge of the first major surface 1a.

Fifth Embodiment

Figure 9A:
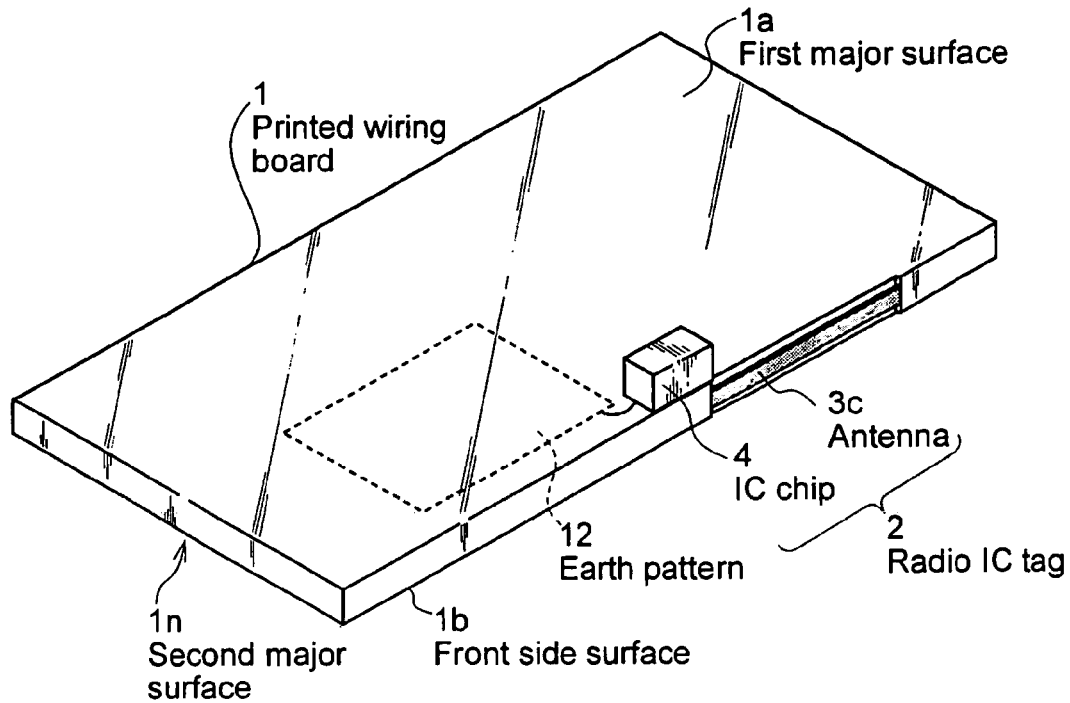
FIGS. 9(a) and 9(b) show views of an IC tag-bearing wiring board in a fifth embodiment according to the present invention.
Figure 9B:
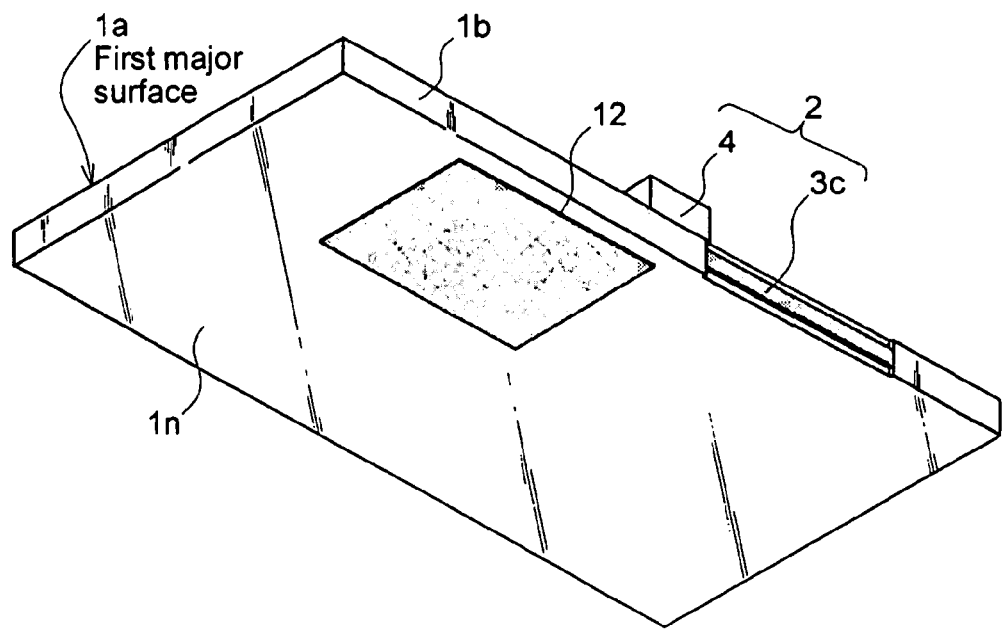
Figure 10A:
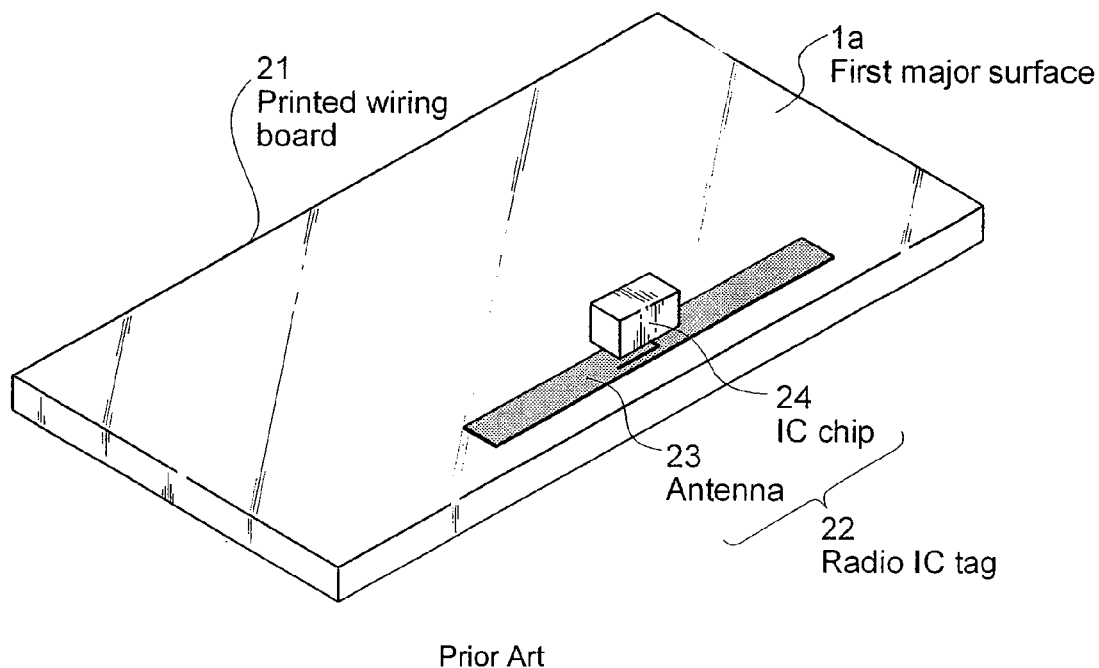
FIGS. 10(a) and 10(b) are a front perspective view and a top view, respectively, of a conventional IC tag-bearing wiring board.
Figure 10B:
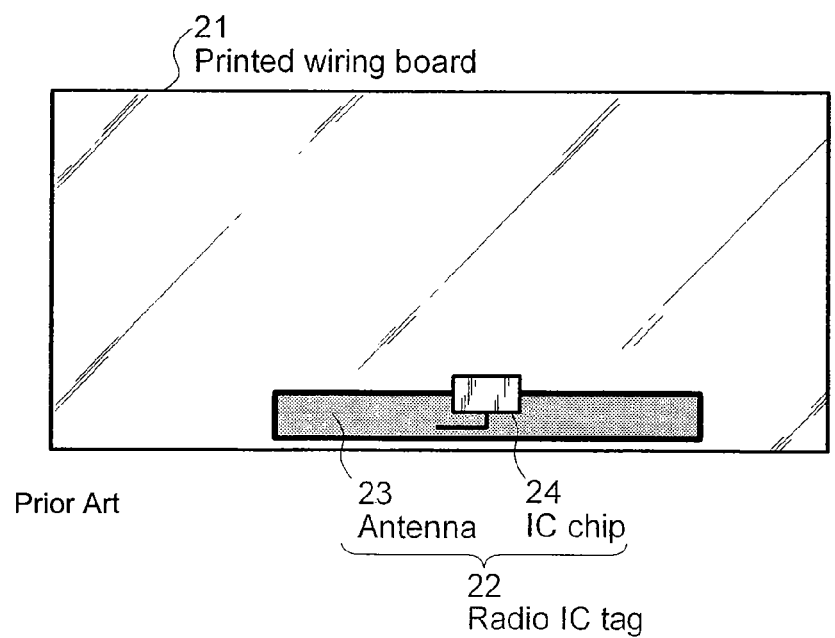

Referring to FIGS. 9(a) and (9(b) showing an IC tag-bearing wiring board in a fifth embodiment according to the present invention, a radiation antenna 3c of a length equal to λ/4, where λ is the wavelength of radio waves to be radiated by the antenna 3c, is formed on one of opposite sides of the middle of the front side surface 1b of a printed wiring board 1, and an IC chip 4 is disposed on a part of a first major surface 1a of the printed wiring board 1 near the middle of the front side surface 1b. An earth pattern 12 of a desired area is formed on a part of a second major surface 1n of the printed wiring board 1 corresponding to a part of the front side surface 1b on the other side of the middle of the front side surface 1b. Since the antenna 3c is a monopole antenna that radiates radio waves, the directivity of the antenna 3c is not affected by an adjacent electronic circuit. An earth pattern included in the electronic circuit may be used as the earth pattern 12. Naturally, the earth pattern 12 may be formed on the first major surface 1a of the printed wiring board 1. If the printed wiring board 1 is a multilayer printed wiring board, the earth pattern 12 may be formed in an inner layer of the multilayer printed wiring board.

The antennas of the foregoing embodiments can be formed in desired patterns by any suitable method other than the plating method, such as a printing method that prints a metal paste, such as a copper or silver paste, on the front side surface of the printed wiring board in a desired pattern and bakes the pattern of the metal paste.

What is claimed is:

1. An IC tag-bearing printed circuit wiring board comprising:
   a radio IC (integrated circuit) tag and an antenna coupled to the IC tag, the IC tag having stored thereon information to be transmitted, the antenna serving to radiate radio waves representative of the stored information to be transmitted, the antenna being disposed on the surface of an edge of the printed circuit wiring board, the edge connecting a first major surface of the printed circuit wiring board and a second major surface of the printed circuit wiring board;
   wherein the antenna is a dipole antenna having a length equal to about one half the nominal wavelength of the radio waves to be radiated;
   wherein the first major surface is a printed circuit surface; and
   an auxiliary antenna disposed on the first major surface or the second major surface, the auxiliary antenna having a long side oriented substantially parallel to the length of the dipole antenna, wherein the long side of the auxiliary antenna is longer than the length of the dipole antenna.

2. The IC tag-bearing wiring board of claim 1 wherein the antenna includes a portion that extends at least partially to and is disposed on the first major surface or to the second major surface.

3. The IC tag-bearing wiring board of claim 1 wherein the antenna includes segments disposed on the opposite sides of the IC tag, each segment being connected to the IC tag by dc short-circuiting.

4. The IC tag-bearing wiring board of claim 1, wherein the auxiliary antenna has a length dependent on the wavelength of the radiated radio waves.

5. The IC tag-bearing wiring board of claim 1, wherein the auxiliary antenna is oriented relative to the dipole antenna such that:
   each of the auxiliary antenna and the dipole antenna has an orthogonal face with a normal pointing away from the printed circuit wiring board; and
   a vector passing from the orthogonal face of the auxiliary antenna through the orthogonal face of the dipole antenna defines a reading direction for reading the radio waves transmitted by the dipole antenna.

6. The IC tag-bearing wiring board of claim 1, wherein the auxiliary antenna is sized and oriented relative to the dipole antenna so as to increase the directionality of the dipole antenna by reflecting at least a portion of the radio waves transmitted by the dipole antenna.

* * * * *